(12) United States Patent
Chen et al.

(10) Patent No.: US 6,910,165 B2
(45) Date of Patent: Jun. 21, 2005

(54) DIGITAL RANDOM NOISE GENERATOR

(75) Inventors: Howard H. Chen, Yorktown Heights, NY (US); Li-Kong Wang, Montvale, NJ (US); Louis L. Hsu, Fishkill, NY (US); Sang H. Dhong, Austin, TX (US); Tin-chee Lo, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 607 days.

(21) Appl. No.: 09/795,899

(22) Filed: Feb. 28, 2001

(65) Prior Publication Data

US 2002/0120898 A1 Aug. 29, 2002

(51) Int. Cl.[7] ............................ G01R 31/28; G06F 11/00
(52) U.S. Cl. ........................................ 714/739; 341/173
(58) Field of Search ......................... 702/191; 341/173; 324/628, 603; 379/24, 26.02; 774/739; 235/462.15; 708/250

(56) References Cited

U.S. PATENT DOCUMENTS

| | | | |
|---|---|---|---|
| 4,176,399 A | | 11/1979 | Hoffmann et al. |
| 4,905,241 A | | 2/1990 | Schmid et al. |
| 5,063,351 A | * | 11/1991 | Goldthorp et al. .......... 324/628 |
| 5,297,151 A | | 3/1994 | Gruetzner et al. |
| 5,444,645 A | * | 8/1995 | Yoshida et al. ............. 708/256 |
| 5,668,507 A | * | 9/1997 | Boerstler et al. ............. 331/78 |

* cited by examiner

Primary Examiner—Guy J. Lamarre
(74) Attorney, Agent, or Firm—Scully, Scott, Murphy & Presser; Satheesh K. Karra, Esq.

(57) ABSTRACT

A system and method for generating random noise for use in testing electronic devices comprises a first random pattern generator circuit for generating first sets of random bit pattern signals; one or more delay devices each receiving a trigger input signal and a random bit pattern signal set for generating in response a respective delay output signal, each delay output signal being delayed in time with respect to a respective trigger signal, a delay time being determined by the bit pattern set received; and, an oscillator circuit device associated with a respective one or more delay devices for receiving a respective delay output signal therefrom and generating a respective oscillating signal, each oscillator signal generated being used to generate artificial random noise for emulating a real noise environment in an electronic device. A second random pattern generator circuit may be provided for generating second sets of random bit pattern signals for receipt by each of the associated oscillator circuit devices in order to frequency adjust in a random manner, each of the oscillator signals.

19 Claims, 7 Drawing Sheets

Waveforms of Noise Generation

Shift-Register

Figure 6(a)

Seed Circuit

DIGITAL RANDOM NOISE GENERATOR

BACKGROUND OF THE INVENTION

1. Field of the Invention

The present invention relates generally to digital circuits and, particularly, to a digital random noise generator system and methodology.

2. Discussion of the Prior Art

It is common in today's highly integrated semiconductor circuit technologies to identify chip function failures caused by the presence of noise. Most noise problems are found in multi-system chips that include analog, digital, and hybrid mixed-signal circuits. For example, a digital circuit such as a microprocessor chip may produce a significant amount of switching noise, for instance, when a clock frequency of that chip exceeds the GHz range. Such a hostile environment adversely degrades the performance of other (mostly analog) circuit systems. As another example, in a high-density memory chip, significant noise is generated by thousands of sense amplifiers switching simultaneously when a row is accessed. Furthermore, noise generated when hundreds of off-chip drivers that simultaneously switch between ground and Vdd, i.e., bounce, due to sudden change in current flow (dI/dt), become a concern for noise sensitive circuits. As another example, devices built on a structure comprising a thin lightly doped epitaxial layer on top of a heavily doped layer that are commonly used to prevent a latch-up related problem, become susceptible to the coupling noise through the substrate.

Noise sensitive circuits are not just limited to the analog circuits. Dynamic logic circuits, those that utilize precharge/predischarge technique, single-ended direct sensing circuits, and area-limiting circuits having floating nodes, etc. are all susceptible to noise disturbance. At the same time, the dynamic circuits themselves also create certain degree of noise due to the simultaneous precharging and discharging action. Achievement of a quiet chip neighborhood is thus an ideal situation, however, is increasingly becoming less realistic in current real chip designs.

There currently exist techniques for testing a circuit's noise immunity. Test macro and analyzing circuits usually small, low density, are mostly operated individually and typically require a noise generator. That is, a semiconductor noise generator is needed for generating noise in order to evaluate newly designed circuits, especially for those circuits which are believed to be noise sensitive. In a testing operation, the noise generator is implemented nearby a test circuit in order to provide the test macro with an artificial switch noise, e.g., for mimicking the noise on the real chip environment.

In order to ensure the circuits function as if operating in real life, noise sensitive circuits must survive creation noise disturbance that the circuit may be subject to while operating in real life. Thus it would be highly desirable that the noise generator, its noise pattern and magnitude must be made configurable, so that a full noise analysis at different noise backgrounds may be carried out.

Furthermore, it would be desirable that the noise generator be small in size, yet permit the degree of the noise, i.e., its magnitude and frequency, to be made tuneable. This would enable one noise generator to be repeatedly used by many different test circuits to mimic different environments. Furthermore, it would additionally be desirable to provide a random noise pattern so that the test circuits may be tested under a situation very close to the real chip operating condition.

U.S. Pat. No. 5,668,507 entitled "Noise generator for evaluating mixed signal integrated circuits" describes a noise generator device comprising a programmable oscillator generating noise signal having a predetermined frequency. It further comprises a programmable load buffer circuit to tune the magnitude of the noise signal. The programmability for this device is accomplished by tapping the capacitor load of a ring oscillator so that the frequency will be altered. The stage of the ring oscillator in this device is also made programmable so that the frequency of the noise can be altered. In addition, the size of the devices may also be changed to cause the frequency of the oscillator and thus the frequency of the noise to change. It provides both coarse and fine tune capabilities to tune the noise frequency. Additionally, in this prior art description, frequency divider circuits are used to divide the frequency.

In the device described in U.S. Pat. No. 5,668,507, the resulting noise pattern has a rather regular format, i.e., the noise has a frequency and magnitude which may vary in specific, or predetermined ranges. In the real chips, such a noise pattern is unlikely to occur, especially for asynchronous circuit designs.

Therefore, it is highly desirable to provide a random noise generator circuit capable of generating a random, or at least pseudo random, noise pattern for noise study, wherein the random noise is defined as a noise pattern having no detectable frequency or magnitude.

SUMMARY OF THE INVENTION

It is an object of the invention to provide a random noise generator circuit that produces truly random signals, i.e., signals having no discernable frequency or magnitude, for testing noise sensitivity of semiconductor circuits.

It is a further object of the invention to provide a random noise generator circuit that produces truly random signals, i.e., signals having no discernable frequency or magnitude, and that are enabled to generate noise mimicking different kinds of noise including, but not limited to noise such as, switching noise, thermal noise, coupling noise, packaging noise, etc.

It is another object of the invention to provide a digital random noise generator circuit that can generate variable patterns of random noise having frequency and magnitude that do not follow any particular pattern and, that further provides the capability of tuning both frequency probability and magnitude probability of the noise.

According to the principles of the invention, there is provided a system and method for generating random noise for use in testing electronic devices comprises a first random pattern generator circuit for generating first sets of random bit pattern signals; one or more delay devices each receiving a trigger input signal and a random bit pattern signal set for generating in response a respective delay output signal, each delay output signal being delayed in time with respect to a respective trigger signal, a delay time being determined by the bit pattern set received; and, an oscillator circuit device associated with a respective one or more delay devices for receiving a respective delay output signal therefrom and generating a respective oscillating signal, each oscillator signal being used to generate artificial random noise for emulating a real noise environment in an electronic device.

Advantageously, a second random pattern generator circuit may be provided for generating second sets of random bit pattern signals for receipt by each of the oscillator circuit devices associated with a respective one or more delay devices in order to frequency adjust in a random manner, each of the oscillator signals.

BRIEF DESCRIPTION OF THE DRAWINGS

Further features, aspects and advantages of the apparatus and methods of the present invention will become better understood with regard to the following description, appended claims, and the accompanying drawings in which:

DETAILED DESCRIPTION OF THE DRAWINGS

Figure 1:
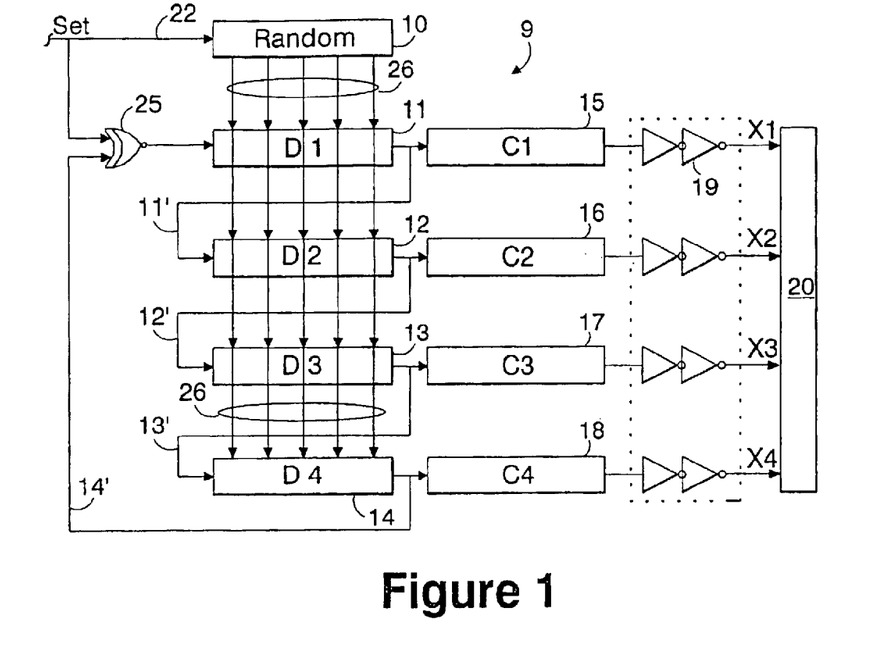
FIG. 1 illustrates a schematic diagram of the random noise generator circuit 10 according to a first embodiment of the invention.

FIG. 1 illustrates a schematic diagram of the random noise generator circuit 9 providing an adjustment scheme according to a first embodiment of the invention. As shown in FIG. 1, the random noise generator circuit 9 includes a random pattern generator component 10 for generating a random pattern of binary bits 26, e.g., 5-digit random binary bits; at least one delay element component; at least one ring-oscillator component; and, at least one output driver. FIG. 1 illustrates an example system comprising four components, namely, a parallel configuration of four digital delay elements numbered D1-D4 for simultaneously receiving the generated random binary bit pattern 26; a parallel configuration of four ring-oscillator components C1-C4 corresponding to each digital delay element D1-D4 for receiving an output from its respective delay element output; and, a parallel configuration of four corresponding output driver circuits 19 for driving respective generated noise signals X1, ..., X4 to a device under test, e.g., power supply or ground 20.

In operation, a set signal 22 and clock signal (not shown) are simultaneously input to the random pattern generator 10 for initiating generation of a random pattern 26. The set signal 22 is additionally input to an XOR gate 25. At every clock cycle or number of clock cycles, the random pattern generator 10 generates 5-digit random binary bits 26, e.g., 11001, 10110, 00011, 10110, etc. for input to each of the digital delay components D1 to D4. In response to an input trigger signal, each delay element will generate a corresponding output signal 11', ... ,14' that functions to control the turn-on time of each respective oscillator C1 to C4 in accordance with a received random binary bit pattern input. Further details regarding the operation of the digital delay elements D1-D4 may be found in commonly-owned, issued U.S. Pat. No. 6,348,827 entitled PROGRAMMING DELAY ELEMENT AND SYNCHRONOUS DRAM USING SAME, the whole contents and disclosure of which is incorporated by reference as if fully set forth herein.

As further shown in FIG. 1, a respective output signal 11', ... , 13' of each delay element functions as a respective trigger input to a next successive digital delay element for initiating the delay operation of each delay element. For example, digital delay element output 11' is input to the delay element D2 to trigger operation of D2, delay element output 12' is input to the D3 element, and delay element output 13' is input to the D4 element. The final delay element output 14' is provided as a feedback input to the XOR gate 25 along with the set input functioning to either terminate or commence the delay operation of delay element D1.

The noise circuit 10 particularly operates as follows: The Set signal 22, and a clock signal (not shown) start the random pattern generator circuit 10 which yields the first 5 binary digits for input to D1 to determine the turn on time of the C1. The Set signal 22 and the feedback signal 14' are preferably initiated at zero to activate the XOR gate 25, and also kick on the D1 delay circuit. As known, the delay element D1 implements the incoming 5 bits to set the delay time. It is understood that the clock period must be longer than the delay time. Once the delay element D1 is on it generates output 11' to enable C1 to oscillate and result in a first noise set.

Figure 2A:
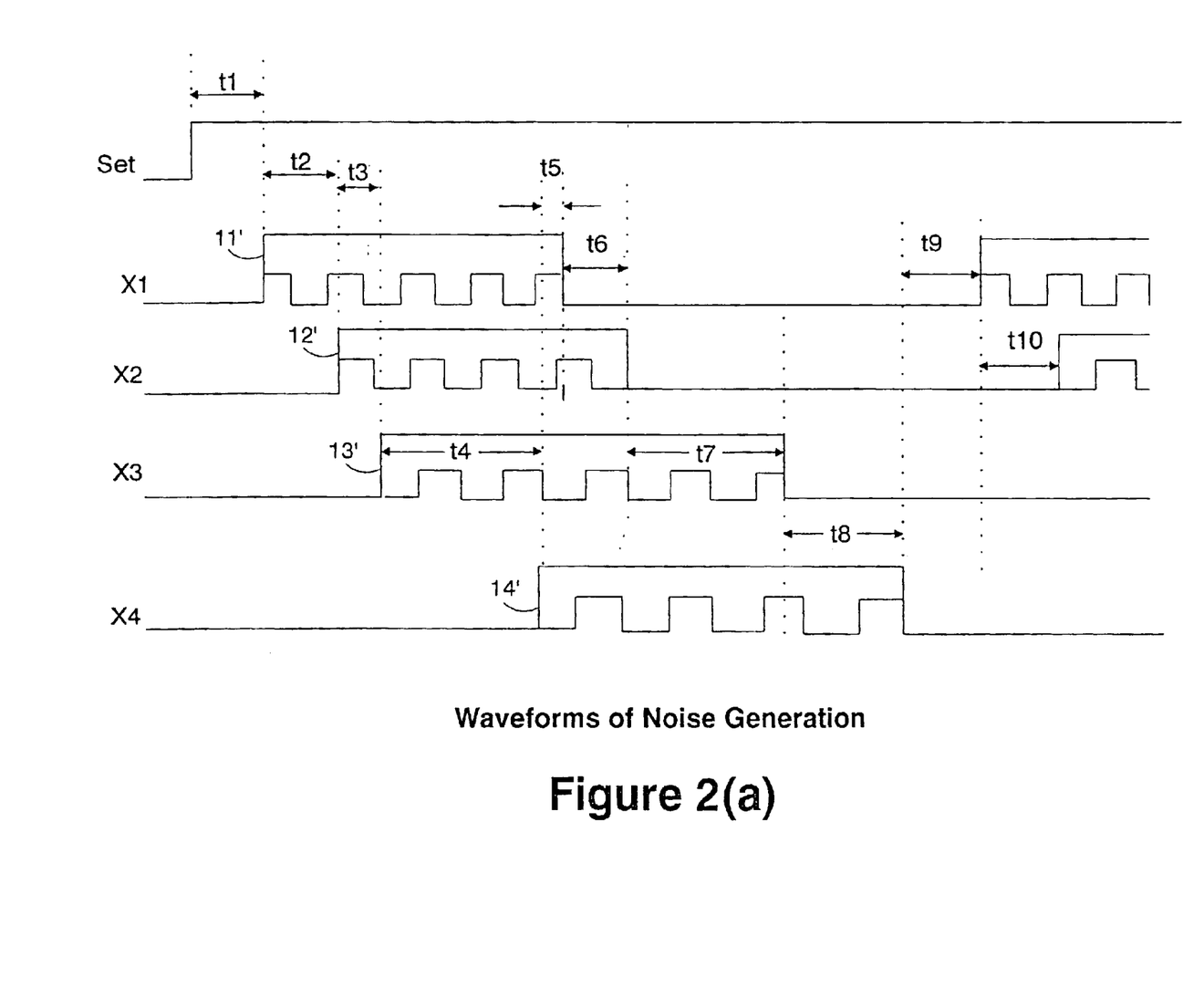
FIG. 2(a) illustrates the various waveform diagrams of the set signal 22, propagating control signals 11'-14' for delay elements D1-D4 and oscillator signals X1-X4 according to a first embodiment of the invention.
Figure 2B:
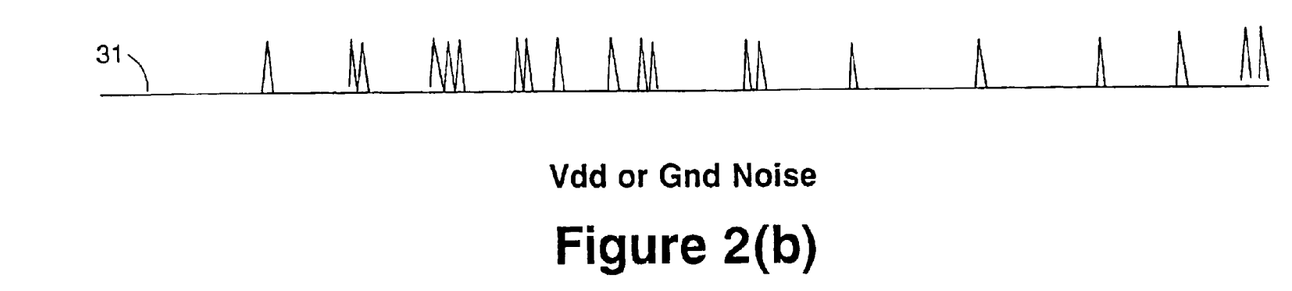
FIG. 2(b) illustrates resultant noise signal 31 generated in accordance with the circuit of FIG. 1.
Figure 2C:
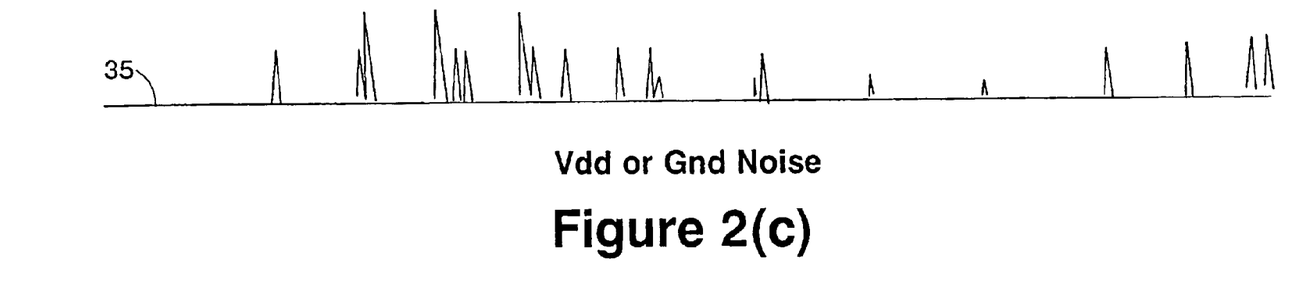
FIG. 2(c) illustrates resultant noise signal 31 generated in accordance with the random noise generator circuit of the third embodiment of the invention depicted in FIG. 4.

FIGS. 2(a)-2(c) illustrate the various waveform diagrams of the set signal 22, and example oscillator output signals X1 to X4 and the example generated noise (Vdd or ground) signals. As shown in FIGS. 1 and 2(a), the random noise generating process may be initiated by a rising edge of the set signal 22. After a first delay time t1 relative to set time (determined by the initial program (5 bits) as input to D1 from random circuit 10, D1 signal 35 and the corresponding oscillator C1 is activated as exemplified in FIG. 2(a). Once the C1 is activated as indicated by the rising edge of signal 11', C2 will be activated after a delay time t2 which is determined by the newly issued random digits (5 bits) from random circuit 10 as input to D2. Activation of C2, as indicated by the rising edge of signal 12', will cause the oscillator C2 to oscillate as exemplified by signal X2 of FIG. 2(a). At this moment in time, the resulting noise will be the sum of the signals X1 and X2 from C1 and C2 respectively, since both are on. Once the D2 is activated, C3 will be activated after a delay time t3 which is determined by the newly issued random digits (5 bits) from random circuit 10 as input to D3. Activation of C3, as indicated by the rising edge of signal 13', will cause the oscillator C3 to oscillate as exemplified by signal X3 of FIG. 2(a). Likewise, once the D3 is activated, C4 will be activated after a delay time t4 which is determined by the newly issued random digits (5 bits) from random circuit 10 as input to D4. Activation of C4, as indicated by the rising edge of signal 14' will cause the oscillator C4 to oscillate as exemplified by signal X4 of FIG. 2(a). At this moment, all the oscillators C1 to C4 are oscillating with a constant frequency to provide outputs X1-X4 as shown in FIG. 2(a).

As in the case of propagating active signals for turning on each oscillator (C1-C4), similarly, oscillator turnoff control signals are propagated sequentially to shut off each of the oscillators. In this instance, the turning off of each oscillator is initiated when oscillator C4 is turned on. That is, the feedback 14' signal (output of D4) is switched from low to high, causing the XOR gate 25 to shut off the D1. The delay time between the turning on of oscillator C4 (D4) on and turning off of oscillator C1 (D1) is indicated as a time t5, as set by the newly issued random digits (5 bits) from random circuit 10 as input to D1. The turning off of oscillator C1 due to falling edge of signal 11' initiates turning off of oscillator C2 after a delay time t6 as set by the newly issued random digits (5 bits) from random circuit 10 as input to D2. Likewise, the turning off of oscillator C2 due to falling edge of signal 12' initiates turning off of oscillator C3 after a delay time t7 as set by the newly issued random digits (5 bits) from random circuit 10 as input to D3. Finally, the turning off of oscillator C3 due to falling edge of signal 13' initiates turning off of oscillator C4 after a delay time t8 as set by the newly issued random digits (5 bits) from random circuit 10 as input to D4.

It should be understood that the process repeats itself such that, at the time output signal 14' of delay circuit D4 is turned off, e.g., falling edge, the signal is input to the XOR gate 25 to initiate again the turning on of oscillator C1 after a delay time t9, which propagates signal 12' to turn on oscillator C2 after delay time t10, and so on.

Returning to FIG. 1, connected to each respective oscillator is a pair of inverter devices 19 which are properly sized to provide a load in order to meet the desired noise magnitude. The device under test 20 for which noise is to be coupled, preferably comprises a power supply, e.g., a Vdd (such as fabricated in a n-well) or a ground (e.g., a p-substrate). FIG. 2(b) illustrates the corresponding noise signals 31 generated as a result of coupling oscillator outputs X1–X4 to the power supply circuit in accordance with the first embodiment. It should be noted from FIG. 2(b) that the magnitude of the noise spikes are identical.

In short, in the first embodiment, the random digits are used to cause variable turn-on and turnoff time of the oscillator components, so that a first order of random noise may be generated.

Figure 3:
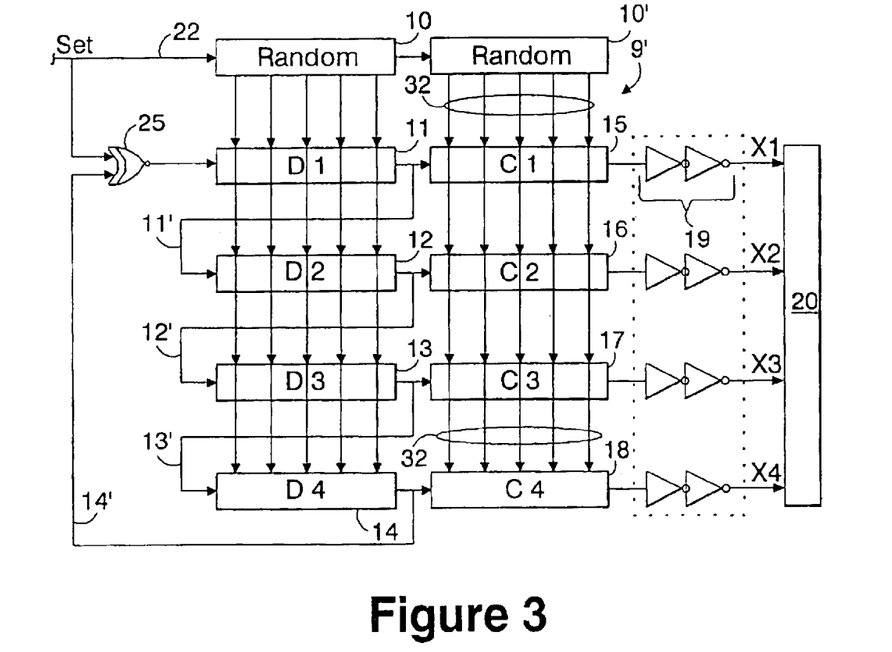
FIG. 3 illustrates a schematic diagram of the random noise generator circuit 9' according to a second embodiment of the invention.

FIG. 3 illustrates a schematic diagram of the random noise generator circuit 9' providing an adjustment scheme according to a second embodiment of the invention. The embodiment of the random noise generator circuit 9' depicted in FIG. 3 is exactly the same as in FIG. 1, however, a second random digit pattern generator random pattern 10' is provided for generating a random pattern of binary bits 32 used for adjusting the frequency of each oscillator circuit C1–C4. Preferably, the frequency adjustment only occurs when the respective oscillator is turned on. As it is already established that the frequency of the oscillator may be altered if the transistor size or R/C loading of each oscillator stage is changed, then the random pattern of binary bits 32 may be used to adjust the size of the pull-up, pull-down device, or size of the R/C loading components included in the respective ring oscillator circuit. Thus, in the second embodiment, for example, shunt transistors (not shown) are implemented to by-pass particular R/C components in an oscillator stage in order to adjust the oscillator loading. In other words, whenever an oscillator C1–C4 is activated in the propagated manner described herein and turned on, the random digits generated by the random digit generator 10' and present at the respective oscillator circuit C1–C4 will initiate the turning on/off of these by-pass transistors to selectively bypass the "R" or "C" component in order to adjust the frequency of the respective oscillator. This frequency control adjustment in conjunction with the random delay adjustment will result in different respective output signals X1–X4 for generating noise in power supply and ground circuits that are different from the noise generated by the circuit 9 of the first embodiment.

Figure 4:
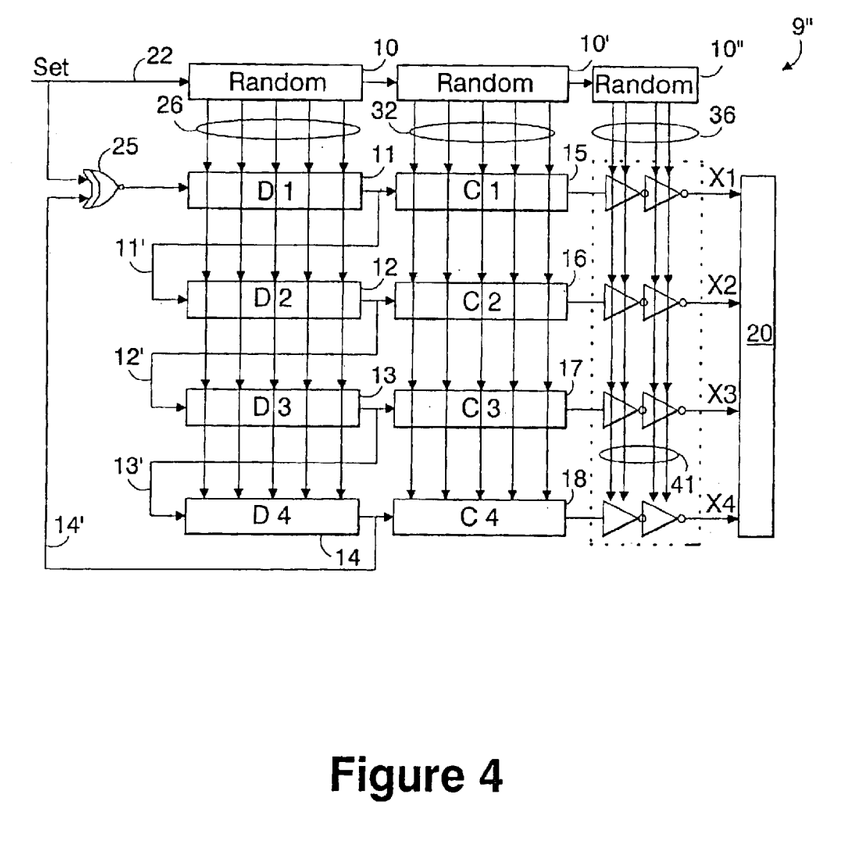
FIG. 4 illustrates a schematic diagram of the random noise generator circuit 9" according to a third embodiment of the invention.

FIG. 4 illustrates a schematic diagram of the random noise generator circuit 9" providing an adjustment scheme according to a third embodiment of the invention. The embodiment of the random noise generator circuit 9" depicted in FIG. 4 is exactly the same as the second embodiment (FIG. 3), however, in the third embodiment, an additional random digit pattern generator random pattern 10" is provided for generating a pattern of binary bits 36 used for randomly adjusting the magnitude of the noise. That is, by activating one or more shunt transistors (not shown) under control of a respective bit of the random pattern of generated bits 36 present at the inverter buffers 19 corresponding to the current operating oscillators, the sizes of the pull-up and pull-down devices present in the inverter buffers 19 may be adjusted, i.e., increased, or decreased, for example. Adjusting the size of the inverter buffers, in effect, alters the magnitude of the resultant noise X1–X4 generated for the corresponding oscillator C1–C4. For example, the larger the buffer driver size, the greater in magnitude of the resultant noise spike generated, and vice versa, the smaller the buffer driver size, the smaller in magnitude the resultant noise spike generated. FIG. 2(c) illustrates the resulting noise waveforms 35 having mixed magnitude generated in accordance with the circuit of the third embodiment of FIG. 4.

Figure 5:
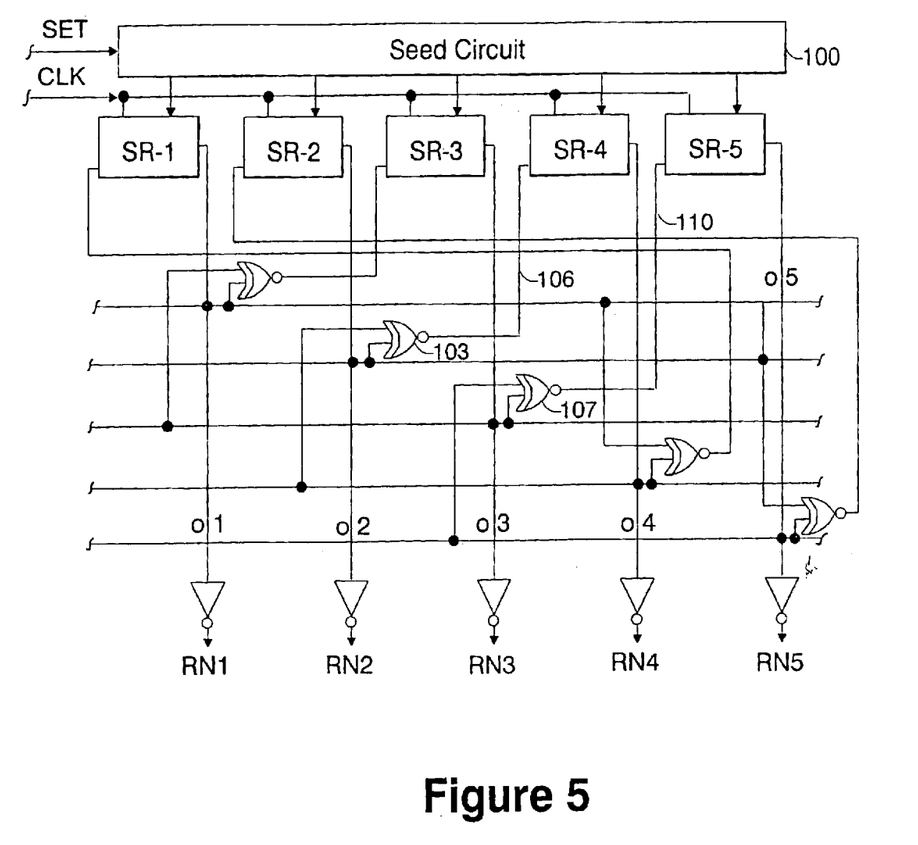
FIG. 5 illustrates a circuit schematic diagram of an example random generator circuit 10.
Figure 6A:
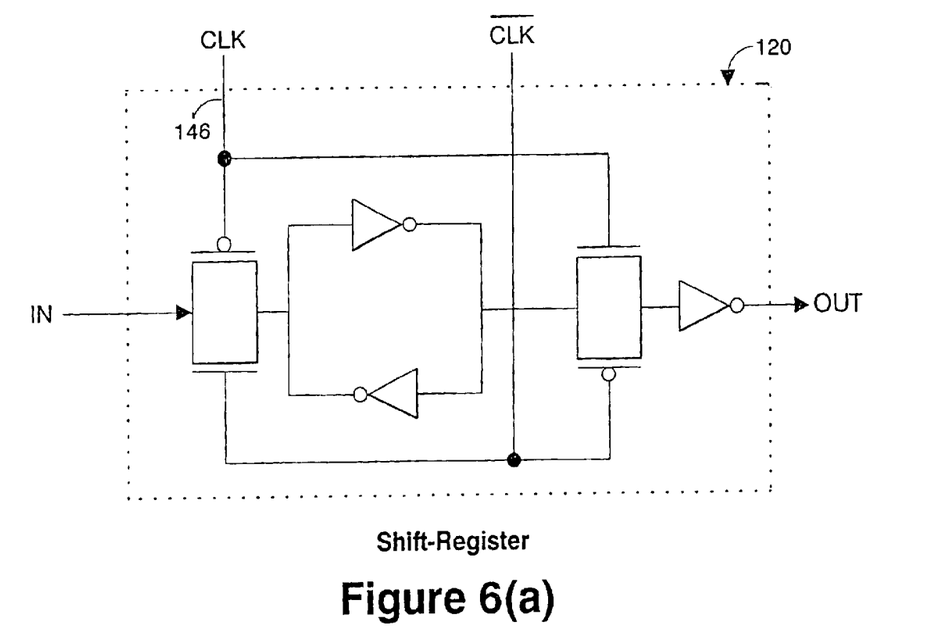
FIG. 6(a) illustrates a circuit schematic diagram 120 of a shift register unit implemented in the random noise generator circuit of the invention.
Figure 6B:
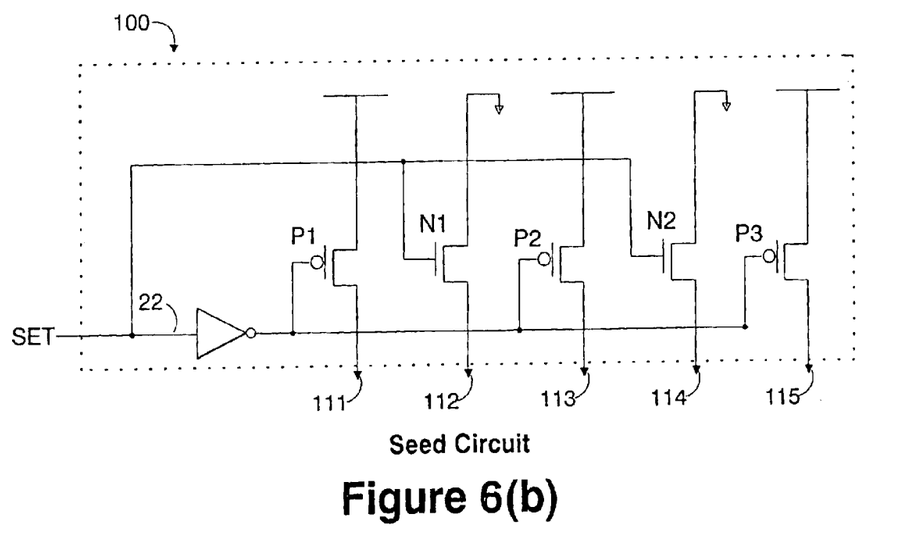
FIG. 6(b) illustrates a circuit schematic diagram of seed circuit 100 for generating data signals that set the initial conditions of each shift register unit.

In accordance with another aspect of the invention, the random pattern generator circuit 10, 10' and 10" described in accordance with the first through third embodiments, is now described with respect to FIG. 5. Although a description is provided for the random pattern generator circuit 10 of FIG. 1, it is understood that the principles of operation described are applicable for each generator circuit 10' and 10" provided for the other two embodiments. In the example random generator circuit 10 of FIG. 5, an amount of stage shift registers corresponding to the number of bits in the respective pattern is provided. In the example circuit 10 described, five (5) stage shift registers SR-1 to SR-5 are implemented since five (5) digits are generated. FIG. 6(a) illustrates a circuit schematic diagram 120 of a shift register unit implemented in the random noise generator circuit of the invention. In operation, a clock signal "CLK" 146 having a certain frequency is chosen to simultaneously trigger each of the shift registers. FIG. 6(b) illustrates a circuit schematic diagram of seed circuit 100 for generating data signals 111–115 that set the initial conditions of each shift register unit. It is easily seen that in the example random bit pattern generator circuit 10, the seed circuit 100 of FIG. 6(b) sets the initial condition of the five registers to a bit pattern '10101' when the set signal 22 is high, however, it should be understood that the initial conditions may be different for each random generator circuit 10, 10' and 10" in the embodiments of FIGS. 3 and 4. It is important note all '0's and all '1's are prohibited for the initial condition signals 111–115, however, any other binary combinations are acceptable.

Referring back to FIG. 5, each initial condition signal 111–115 is fed into a respective clock complement signal "$\overline{CLK}$" input 147 of a respective shift register. The output of each register (O1–O5) is respectively fed together with the output of the second previous stage shift register into a respective XOR gate. For instance, the XOR gate 103 receives a signal O4 output of shift register SR-4 and a signal O2 output of shift register SR-2 and generates an output 106 which is fed to the input of Shift Register SR-4; likewise, XOR gate 107 receives a signal O5 output of shift register SR-5 and a signal O3 output of shift register SR-3 and generates an output 110 which is fed to the input of Shift Register SR-5; and so on. At the same time, the output of each shift register O1 to O5 are forwarded to one or more inverters 111–115 to generate the final random digits herein labeled RN1 to RN5 corresponding to shift registers SR-1 to SR-5, respectively. It is these signals are input to the delay circuits and ring oscillator circuits for generating random signal patterns to provide random noise on a chip. It should be understood that other configurations of the above described random pattern generator circuit 10 are possible. For example, the XOR gate 103 may receive a signal O4 output of shift register SR-4 and a signal O2 output of shift register SR-2 and generates an output which is fed to the input of Shift Register SR-3. It is understood that such configuration changes directed to XOR gate inputs and output connections to the serial shift registers may control the degree of pseudo-randomness in the random pattern generator.

Figure 7:
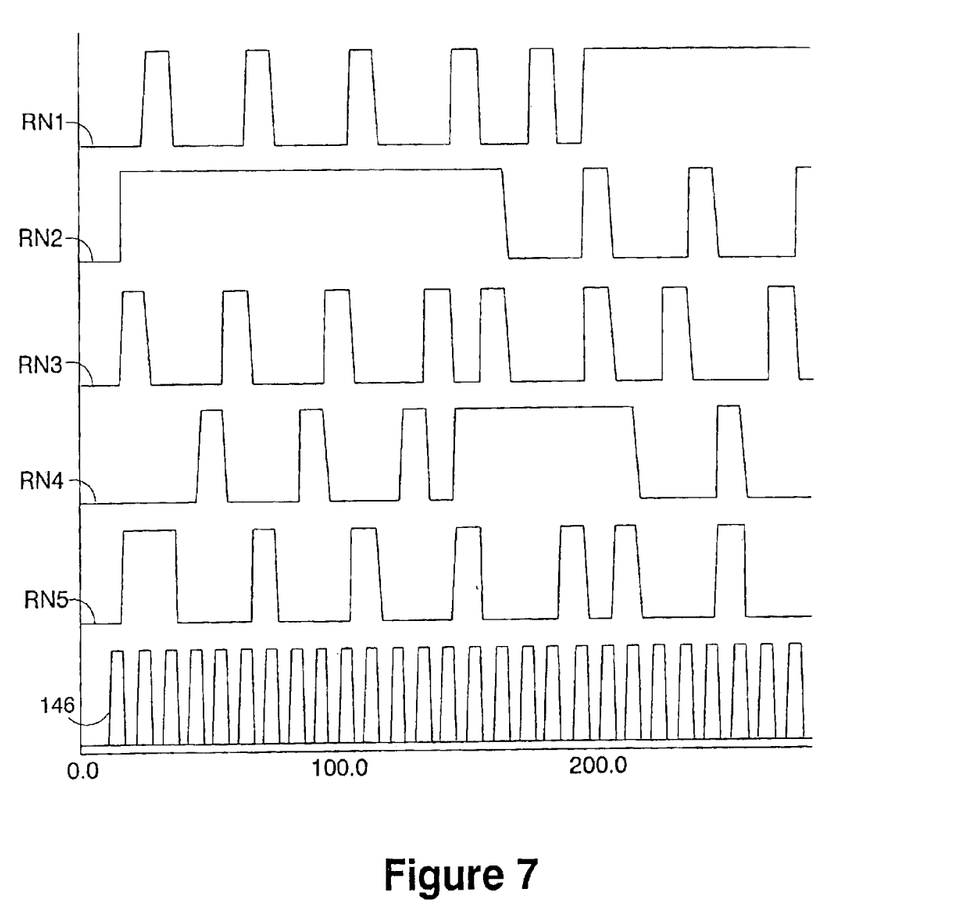
FIG. 7 illustrates an example HSPICE simulation of the random pattern generator circuit 10 showing the output signals RN1 to RN5 of respective shift registers of FIG. 5.

FIG. 7 illustrates an example HSPICE simulation of the random pattern generator circuit 10 showing the output signals RN1 to RN5 of respective shift registers SR-1 to SR-5 after a number of clock cycles 146.

While the invention has been particularly shown and described with respect to illustrative and preformed embodiments thereof, it will be understood by those skilled in the art that the foregoing and other changes in form and details may be made therein without departing from the spirit and scope of the invention which should be limited only by the scope of the appended claims.

What is claimed is:

1. A digital random noise generator comprising:
   a first pseudo-random pattern generator circuit for generating first sets of random bit pattern signals;
   two or more delay devices in a parallel configuration each receiving a trigger input signal and a random bit pattern signal set for generating in response a respective delay output signal in parallel paths, each delay output signal being delayed in time with respect to a respective said trigger signal and functioning as a trigger input signal of a successive delay device of said parallel configuration for commencing operation of a successive delay device in said parallel configuration, a delay time of each delay output signal being determined by said bit pattern set received;
   an oscillator circuit device associated with a respective delay device for receiving a respective delay output signal therefrom and generating a respective oscillating signal, each oscillator signal being used to generate artificial pseudo-random noise for emulating a real noise environment in an electronic device.

2. The digital random noise generator according to claim 1, further comprising a buffer circuit for receiving each said generated oscillating signal and for converting said generated oscillating signal into a noise signal.

3. The digital random noise generator according to claim 1, wherein said two or more delay devices and corresponding oscillator circuit devices operate in a parallel and sequential configuration for generating a set of oscillating signals having a cumulative noise effect for input to a semiconductor device.

4. The digital random noise generator according to claim 3, wherein each trigger signal arrives at a successive delay circuit according to a delay time determined by a bit pattern set received at an immediate previous delay circuit providing said trigger input.

5. The digital random noise generator according to claim 3, wherein said bit pattern set received at a respective delay circuit randomly changes at a time of receipt of a respective trigger signal.

6. The digital random noise generator according to claim 3, wherein each delayed output signal includes first and second edges, said generator further including feedback mechanism for terminating generation of a delayed output signal of a first delay circuit device in response to receipt of said first edge of a delayed output signal from a last delay circuit device of said parallel and sequential configuration.

7. The digital random pseudo-noise generator according to claim 6, wherein said feedback mechanism commences successive operation of said delay circuit devices in response to receipt of said second edge of a delayed output signal from a last delay circuit device of said parallel and sequential configuration.

8. The digital random noise generator according to claim 3, further comprising: a second pseudo-random pattern generator circuit for generating second sets of random bit pattern signals for randomly adjusting an oscillation frequency of said each oscillator circuit device.

9. The digital random noise generator according to claim 3, further comprising: a third pseudo-random pattern generator circuit for generating third sets of random bit pattern signals for randomly adjusting a noise amplitude characteristic by randomly adjusting a size of said buffer circuit.

10. The digital random noise generator according to claim 1, wherein the pseudo-random pattern generator circuit comprises:
    a seed circuit for generating an initial n-bit pattern;
    a clock signal;
    a shift register unit comprising n shift registers, each register generating a respective random bit pattern signal in response to receipt of a respective bit of said initial n-bit pattern and a clock signal; and,
    n XOR gates, each XOR gate associated with a respective shift register, wherein each XOR gate receives an output of a first shift register and an output of a second shift register for generating an input signal to a third shift register, wherein a pseudo random bit pattern is generated.

11. A method for generating random noise for use in testing electronic devices, said method comprising the steps of:
    a) generating first sets of random bit pattern signals;
    b) providing two or more delay circuit devices in a parallel configuration each for generating respective delay output signals in response to a received bit pattern set and trigger signal inputs, each delay output signal being delayed in time with respect to a respective input trigger signal and functioning as a trigger input signal of a successive delay device of said parallel configuration for commencing operation of a successive delay device in said parallel configuration, a delay time of each delay output signal being determined by said bit pattern set received;
    c) generating respective oscillating signals in parallel paths in response to received output delay signals, wherein each oscillator signal is used to generate artificial random noise for emulating a real noise environment in an electronic device.

12. The method for generating random noise according to claim 11, further comprising the step of: receiving each said generated oscillating signal and converting each said generated oscillating signal into a noise signal for simulating noise in said electronic device.

13. The method for generating random noise according to claim 12, wherein each trigger signal arrives at a successive delay circuit according to a delay time determined by a bit pattern set received at an immediate previous delay circuit providing said trigger input.

14. The method for generating random noise according to claim 13, wherein each delayed output signal includes first and second edges, said method further including the step of: providing feedback signal for terminating generation of a delayed output signal of a first delay circuit device in response to receipt of said first edge of a delayed output signal from a last delay circuit device of said parallel and sequential configuration.

15. The method for generating random noise according to claim 14, further including the step of commencing successive operation of said delay circuit devices in response to receipt of said second edge of said delayed output signal from said last delay circuit device of said parallel and sequential configuration.

16. The method for generating random noise according to claim 12, further including the step of randomly changing a bit pattern set received at a respective delay circuit at a time of receipt of a respective trigger signal.

17. The method for generating random noise according to claim 12, further the step of: generating second sets of random bit pattern signals for randomly adjusting an oscillation frequency of each said oscillator signal at each successive operation.

18. The method for generating random noise according to claim 12, further comprising the step of: generating third sets of random bit pattern signals for randomly adjusting an amplitude characteristic of noise spikes by randomly adjusting a size of said buffer circuit.

19. The method for generating random noise according to claim 11, further comprising the step of: operating said two or more delay circuit devices in a parallel and sequential configuration for simultaneously generating a set of oscillating signals having a cumulative noise effect for input to said electronic device.

* * * * *